US010538334B2

(12) United States Patent
Pozzi et al.

(10) Patent No.: US 10,538,334 B2
(45) Date of Patent: Jan. 21, 2020

(54) UNDERSEAT REPLACEABLE IN-FLIGHT ENTERTAINMENT CABLING ASSEMBLY

(71) Applicant: Rockwell Collins, Inc., Cedar Rapids, IA (US)

(72) Inventors: Alexander Pozzi, Winston-Salem, NC (US); Martin McGinley, Winston-Salem, NC (US); Stuart McKee, Winston-Salem, NC (US); Ross Kane, Winston-Salem, NC (US); James Briggs, Winston-Salem, NC (US); Harry Clements, Winston-Salem, NC (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 157 days.

(21) Appl. No.: 15/793,842

(22) Filed: Oct. 25, 2017

(65) Prior Publication Data

US 2019/0118950 A1    Apr. 25, 2019

(51) Int. Cl.
| | |
|---|---|
| *B64D 11/06* | (2006.01) |
| *B64D 11/00* | (2006.01) |
| *H05K 7/14* | (2006.01) |

(52) U.S. Cl.
CPC ...... *B64D 11/0624* (2014.12); *B64D 11/0015* (2013.01); *H05K 7/1412* (2013.01)

(58) Field of Classification Search
CPC ............ B64D 11/0624; B64D 11/0015; H05K 7/1412

(Continued)

(56) References Cited

U.S. PATENT DOCUMENTS 6,899,390 B2    5/2005  Sanfrod et al.
9,481,465 B2 *  11/2016  Pajic ................... B64D 11/0015
(Continued)

FOREIGN PATENT DOCUMENTS

| EP | 1647483 A1 * | 4/2006 | ............ B64D 11/06 |
| EP | 3142223 A2 | 3/2017 | |
| EP | 3208194 A1 | 8/2017 | |

OTHER PUBLICATIONS

Extended Search Report dated Feb. 12, 2019 for EP Patent Application No. 18202564.3.

*Primary Examiner* — Milton Nelson, Jr.
(74) *Attorney, Agent, or Firm* — Suiter Swantz pc llo

(57) ABSTRACT

An aircraft seating assembly including a replaceable underseat passenger accommodation feature tray includes passenger seats incorporating in-flight entertainment (IFE) system components for the use of the occupying passengers or neighboring passengers in the seats immediately behind. The IFE system components are connected by internal cabling paths within the seating assembly to contact points, and seat electronic boxes (SEB) mounted to a replaceable passenger accommodation feature tray provide IFE services to the system components. The SEB is connected to a second set of contact points on the feature tray by cabling paths that circumvent the spreader and leg structures of the seating assembly. When the feature tray is fully mounted to the seating assembly, the SEB is connected to the IFE system components through the cabling paths and contact points at which the cabling paths terminate, each contact point on the feature tray having a counterpart in the seating assembly.

15 Claims, 15 Drawing Sheets

(58) Field of Classification Search
USPC .............................................. 297/217.3, 144
See application file for complete search history.

(56) References Cited

U.S. PATENT DOCUMENTS

| | | |
|---|---|---|
| 2005/0268319 A1 | 12/2005 | Brady, Jr. |
| 2016/0297533 A1 | 10/2016 | Le et al. |
| 2017/0021933 A1 | 1/2017 | Pozzi et al. |
| 2019/0031366 A1* | 1/2019 | Lauer .................... B64D 45/00 |

* cited by examiner

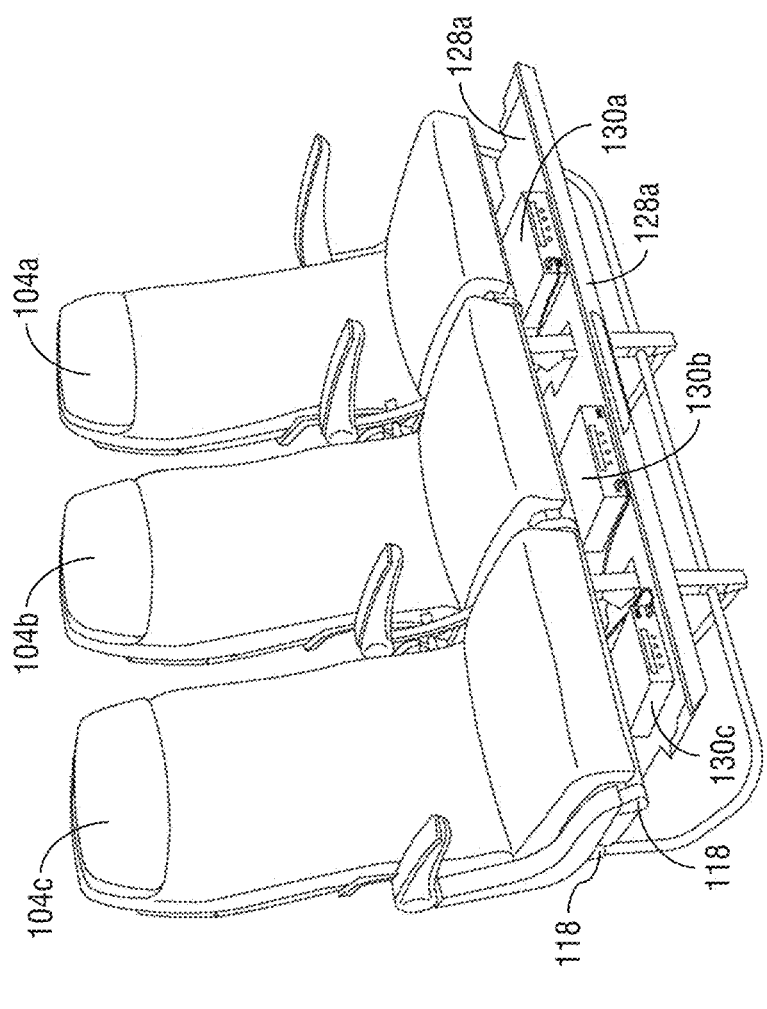

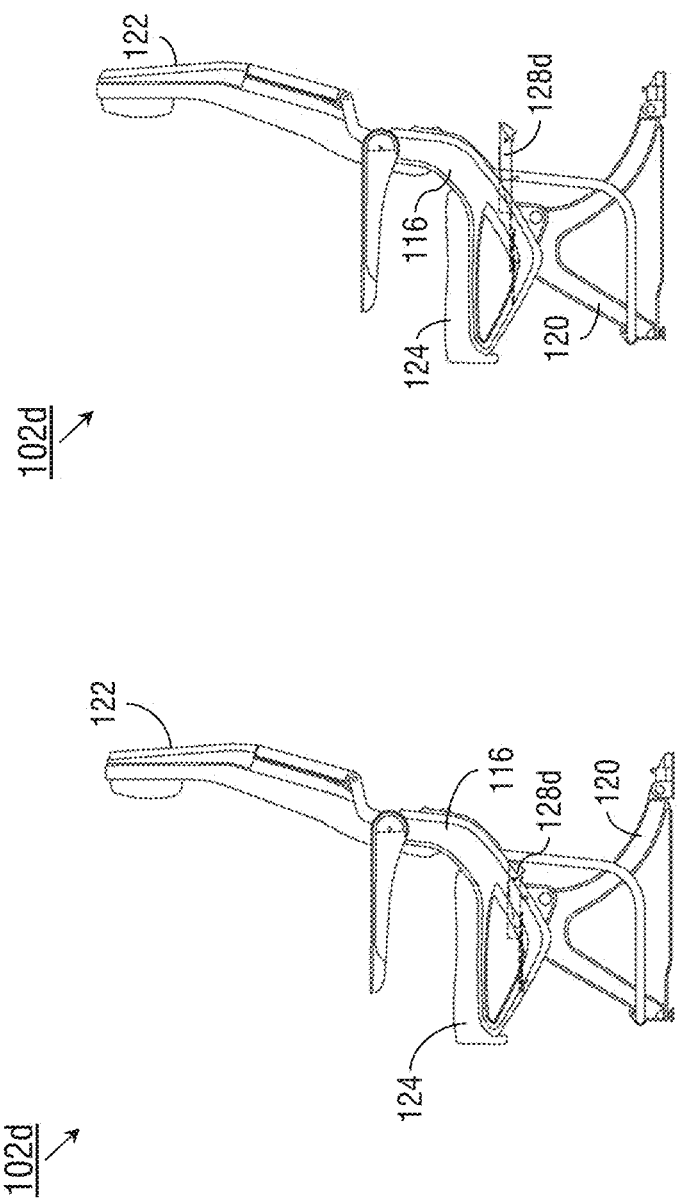

UNDERSEAT REPLACEABLE IN-FLIGHT ENTERTAINMENT CABLING ASSEMBLY

BACKGROUND

In-flight entertainment (IFE) systems have the capacity to connect commercial air travelers to audiovisual content and the Internet without leaving their seats. For example, passengers may access onboard IFE systems via components built into the forward seat or bulkhead: monitors, communications ports, power outlets, etc. Conventional IFE systems use a seat electronic box (SEB) to link the IFE system to each passenger seat or group of seats. However, the cabling and wiring necessary to connect a SEB to individual seatback IFE components must be integrated into the seating to such a degree that servicing or upgrading any system components is impractical without replacing the entire seating assembly.

For example, a single SEB may provide IFE services to a group of seats (usually two, three, or four) separated by spreaders (e.g., aluminum components with partially hollow or tubular structures) and mounted to the cabin interior by leg structures. In order to run cabling from the SEB (which must itself be mounted to a passenger seat) to each individual seatback-mounted monitor without compromising passenger comfort, the cabling must be run through the seat spreaders (which may need to be designed with hollow or tubular portions for this purpose) and ziptied to the spreaders to hold the cabling in place and out of the way of passengers. As a result, not only is installation of the SEB and IFE end components a cumbersome and complicated process, but servicing the system, or upgrading any of its individual components, may not be possible without at least partial dismantling of the seating assembly.

SUMMARY

In an aspect, embodiments of the inventive concepts disclosed herein are directed to a seating assembly for an aircraft or other mobile platform. The seating assembly includes a grouping of passenger seats (e.g., two, three, four) separated by spreader structures, each seat including a seatback, seat frame, seat cushion, and seatpan collectively supporting the occupying passenger. Each passenger seat includes one or more peripheral devices via which in-flight entertainment (IFE) services may be accessed, either by the occupying passenger or adjacent passengers (e.g., occupying passengers may access armrest-mounted ports or controllers while passengers seated directly behind the seating assembly may access seatback-mounted displays). The peripheral devices are connected by cabling paths to connection ports in the seat frame or seatback structure. The seating assembly includes a seat electronic box (SEB) wirelessly connected to IFE systems onboard the aircraft. The SEB is attached to a line replaceable unit (LRU), such as a passenger accommodation feature tray, mountable as a unit to the seating assembly. Cabling paths within the structure of the LRU connect the SEB to a second set of connection ports, which contact the first set of connection ports within the seat frames/seatbacks to connect the peripheral devices in each passenger seat to the SEB. The cabling paths within the LRU circumvent the spreader and leg structures of the seating assembly, allowing the LRU to be installed or removed as a unit, without the need to rewire the connections between the SEB and the peripheral devices.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings:

FIG. 2C is a forward perspective view of the seating assembly of FIG. 2B;

FIG. 4A is a side view of the seating assembly of FIG. 2A;

FIG. 4B is a side view of the seating assembly of FIG. 4A in a partially mounted configuration;

DETAILED DESCRIPTION OF EXEMPLARY EMBODIMENTS

Figure 1:
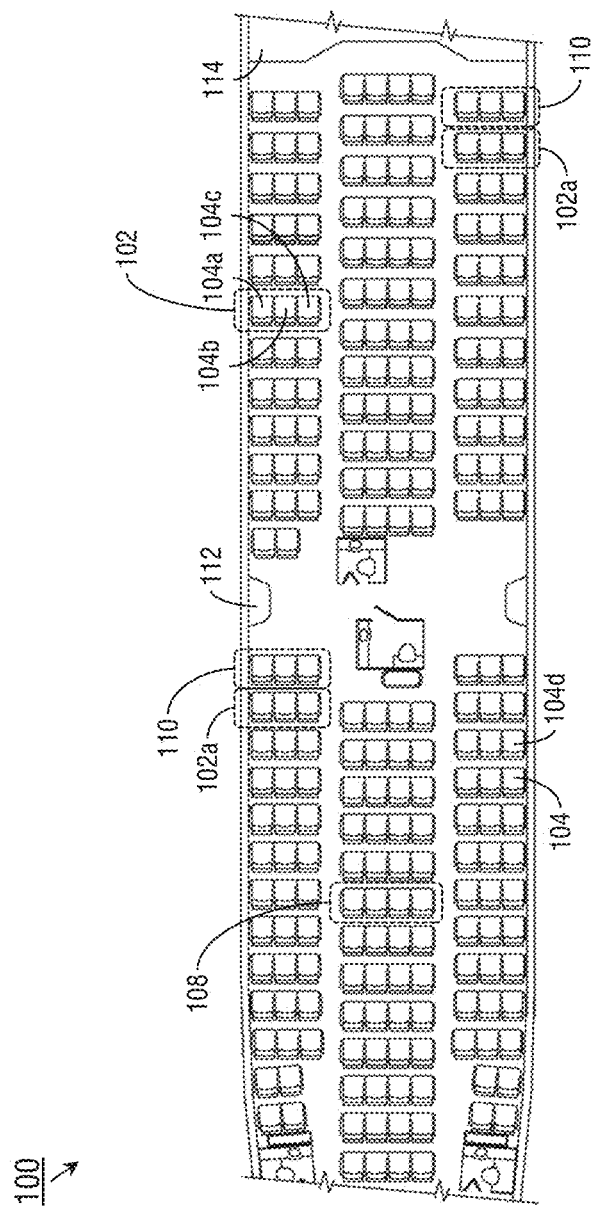
FIG. 1 is an overhead view of an aircraft cabin interior.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1*a*, 1*b*). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to an aircraft seating assembly incorporating a line replaceable unit (LRU) including seat electronic boxes (SEB) and dedicated cabling paths for connecting the SEB to contact ports on the LRU, the cabling paths routed around spreader or leg structures of the seating assembly. The passenger accommodation feature tray may thus be installed or removed as a unit, without the need to remove or replace individual wirings or allow for space within the spreader and leg structures to accommodate said wirings (e.g., keeping wires or cables out of the way of seated passengers). The simpler installation and removal allows for easier retrofitting of onboard IFE systems. Furthermore, the LRU can more easily be upgraded for compatibility with next-generation hardware and software.

Referring to FIG. 1, an aircraft 100 may incorporate one or more onboard in-flight entertainment (IFE) systems in order to provide audio-visual content, Internet connectivity, electrical power, and other services to passengers. The selection of accommodations (e.g., services, features) available to a given passenger may vary depending on the seating configuration (e.g., coach, premium coach, business class, first class) or on the current flight segment (e.g., whether the aircraft 100 is parked at a gate, taxiing along a runway, taking off, landing, or cruising at altitude). The interior cabin of the aircraft 100 may provide passenger seating via seating assemblies 102, each seating assembly incorporating a group of individual passenger seats 104 (e.g., a window seat 104*a*, a middle seat 104*b*, an aisle seat 104*c*). Seating assemblies 102 may include forward-facing or aft-facing seats in groups of two (double seating assembly 106), three, (triple seating assembly 102), four (quadruple seating assembly 108) or more, depending on the desired seating configuration. Each individual seating assembly 102 may be mounted to the interior of the aircraft 100 as a unit, e.g., bolted to floor tracks extending longitudinally through the aircraft 100. Each passenger occupying an individual passenger seat 104 may access one or more IFE services at his or her seat via peripheral devices built into the seating assembly 102 (e.g., an audio port, power outlet, video display, or seat/window controller built into an armrest or seatback), or via their own mobile computing or communications devices (e.g., smartphones, tablets) via data and communications ports built into the seating assembly. For example, a passenger occupying the passenger seat 104 may utilize a video display unit built into the forward seat (104*d*) or plug their mobile device into a network port built into the forward seat 104*d*, e.g., to access streaming audio/visual content or satellite-assisted broadband Internet service through the mobile device.

Some seating assemblies 110, due to their placement within the aircraft 100, may incorporate alternative placement of peripheral devices and components for use by the occupying passenger. For example, some seating assemblies 110 may be positioned adjacent to an exit (112) or a forward bulkhead (114), requiring a video display, ports, or outlets to be situated somewhere other than a forward seat. Accordingly, while the seating assemblies 102*a* may incorporate peripheral devices (e.g., rear-mounted display units) for the use of passengers occupying adjacent seating assemblies (102*a*), the seating assemblies 102*a* may include additional components such as armrest-mounted display units (see, e.g., FIG. 8) for the use of occupants who may not have a passenger seat directly forward.

Figure 2A:
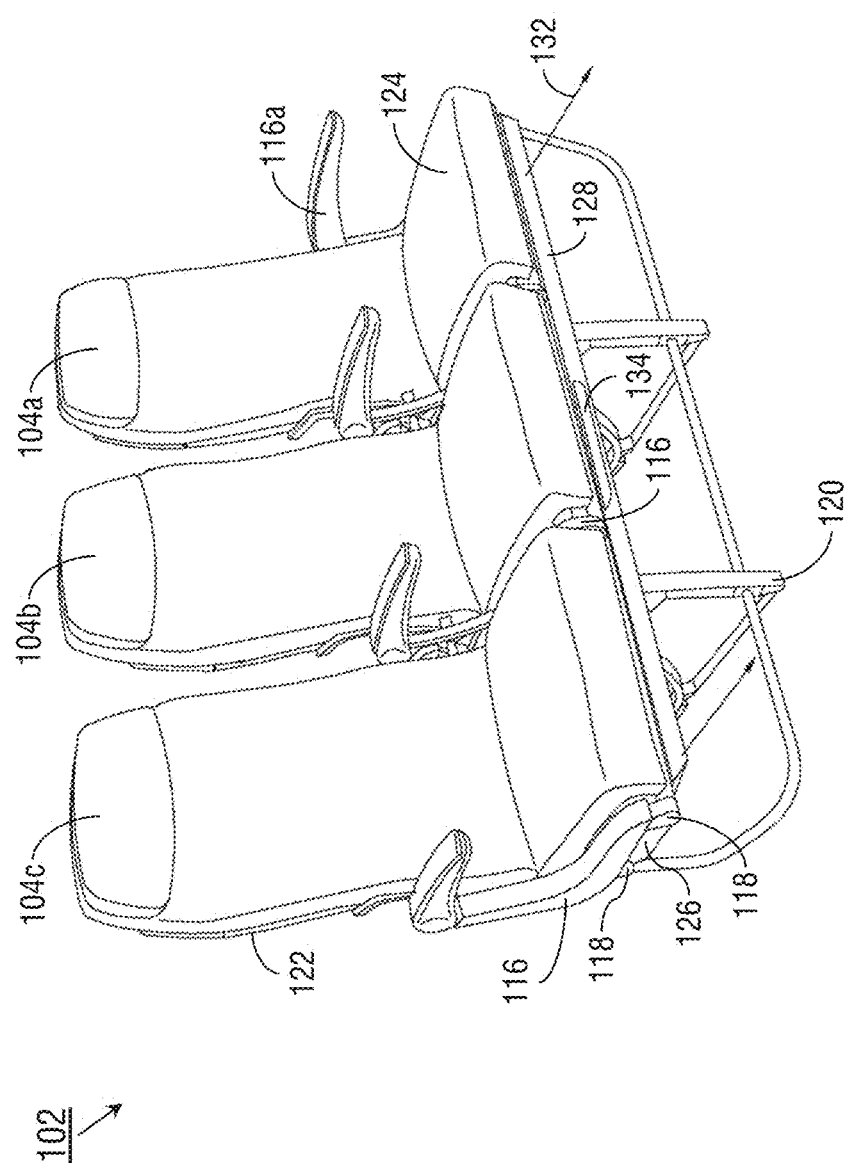
FIG. 2A is a forward perspective view of an exemplary embodiment of a seating assembly according to the inventive concepts disclosed herein.
Figure 2B:
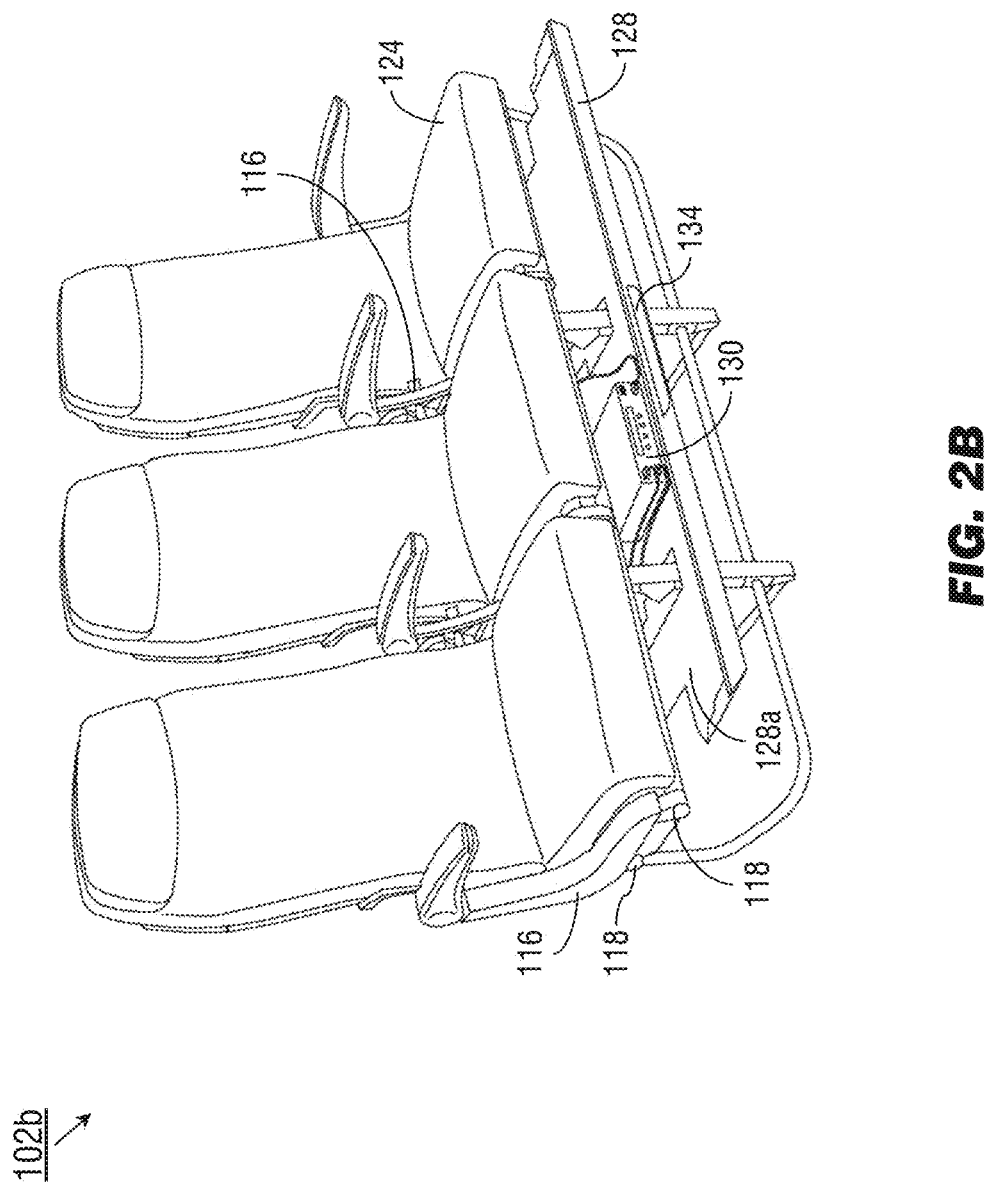
FIG. 2B is a forward perspective view of the seating assembly of FIG. 2A in a partially mounted configuration.

Referring now to FIGS. 2A through 2C, the seating assembly 102 shown by FIG. 1 may include passenger seats 104*a-c* separated by spreader structures 116 (which may include armrests 116*a* mounted thereon). The spreader structures 116 may be mounted atop lateral rails 118, which may extend laterally (e.g., substantially orthogonal to the longitudinal axis of the aircraft 100 (FIG. 1)) to provide structural stability to the seating assembly 102. The seating assembly 102 may be secured to the floor of the aircraft 100 via one or more leg structures 120 (e.g., secured to floor tracks running longitudinally along the aircraft cabin interior). Each passenger seat 104*a-c* may incorporate a seatback 122 pivotably mounted to a seat frame (e.g., to allow the passenger seats 104*a-c* to recline), seat cushions 124 positioned atop a seatpan 126 or similar cushion support structure (CSS), which may be a solid seatpan, a flexible membrane, or any appropriate structure for holding the seat cushion 124 in place and supporting the occupying passenger. Each passenger seat 104*a-c* may include one or more peripheral devices (e.g., IFE system components), either for use by adjacent passengers or by the occupants of the passenger seats 104*a-c*. The seating assembly 102 may include a line replaceable unit (LRU) such as a passenger accommodation feature tray 128 (e.g., cabling harness, cabling assembly, electrical harness) to which a seat electronic box 130 (SEB) is mounted. For example, each seating assembly 102 may include an SEB 130 for providing access to IFE services to occupants of the passenger seats 104*a-b* (and/or the adjacent passenger seats). However, rather than wire the SEB 130 directly to each peripheral device of the seating assembly 102 (e.g., running wires and cables from a display unit mounted in the seatback 122 of the aisle seat 104*c* to the SEB, through gaps in the spreader structures 116), the passenger accommodation feature tray 128 may incorporate both the SEB 130 and predetermined cabling paths connecting the SEB to external connection ports, so that the passenger accommodation feature tray 128 can be mounted to and removed from the seating assembly 102 as a single unit, without securing wires or cables to (or removing said wires and cables from) the structure of the seating assembly 102.

Referring to FIG. 2B, the seating assembly 102b may be implemented and may function similarly to the seating assembly 102 of FIG. 2A, except that the seating assembly 102b shows the passenger accommodation feature tray 128 in a semi-mounted or partially mounted configuration (as compared to the fully mounted configuration shown by FIG. 2A). For example, the passenger accommodation feature tray 128 may be partially unfastened from the seating assembly 102, or the passenger accommodation feature tray 128 may slide forward (132) relative to the seating assembly 102, such that the passenger accommodation feature tray 128 remains partially attached to the seating assembly 102 but the SEB 130 or other components of the passenger accommodation feature tray 128 may be accessed, replaced, or serviced. The passenger accommodation feature tray 128 may be mounted to the seating assembly 102 such that the flat, or tray, portion (128a) of the passenger accommodation feature tray is disposed substantially flush with the underside of the lateral rails 118, placing the SEB 130 between the lateral rails. The positioning of the tray portion 128a may provide several advantages. For example, the available space underneath the passenger accommodation feature tray 128 may provide maximum leg room for passengers seated directly behind the seating assembly 102 (or, alternatively, room for temporary underseat stowage of carry-on items). In addition, the amount of free space between the tray portion 128a and the seat cushion 124 (as well as the seatpan 126, FIG. 1) may be minimized, preventing an unauthorized individual from accessing the passenger accommodation feature tray 128 and placing a weapon or similar device therein. The passenger accommodation feature tray 128 and its components (e.g., the SEB 130 and cabling paths connected thereto) may circumvent spreader structures 116 and leg structures 120 so that the passenger accommodation feature tray 128 may be installable or removable as a single unit. The passenger accommodation feature tray 128 may include an access handle 134 for articulating the passenger accommodation feature tray 128 between a fully-mounted and partially-mounted configuration.

Referring in particular to FIG. 2C, a seating assembly 102c may be implemented and may function similarly to the seating assemblies 102, 102b, except that the seating assembly 102c may incorporate multiple SEB 130a-c mounted to the passenger accommodation feature tray 128. For example, each individual SEB 130a-c may be dedicated to a passenger seat 104a-c and connected thereto, or various SEB may connect the occupants of the seating assembly 102c to diverse onboard IFE systems and services (e.g., a first SEB for satellite-based broadband, a second SEB for audiovisual content).

Figure 3A:
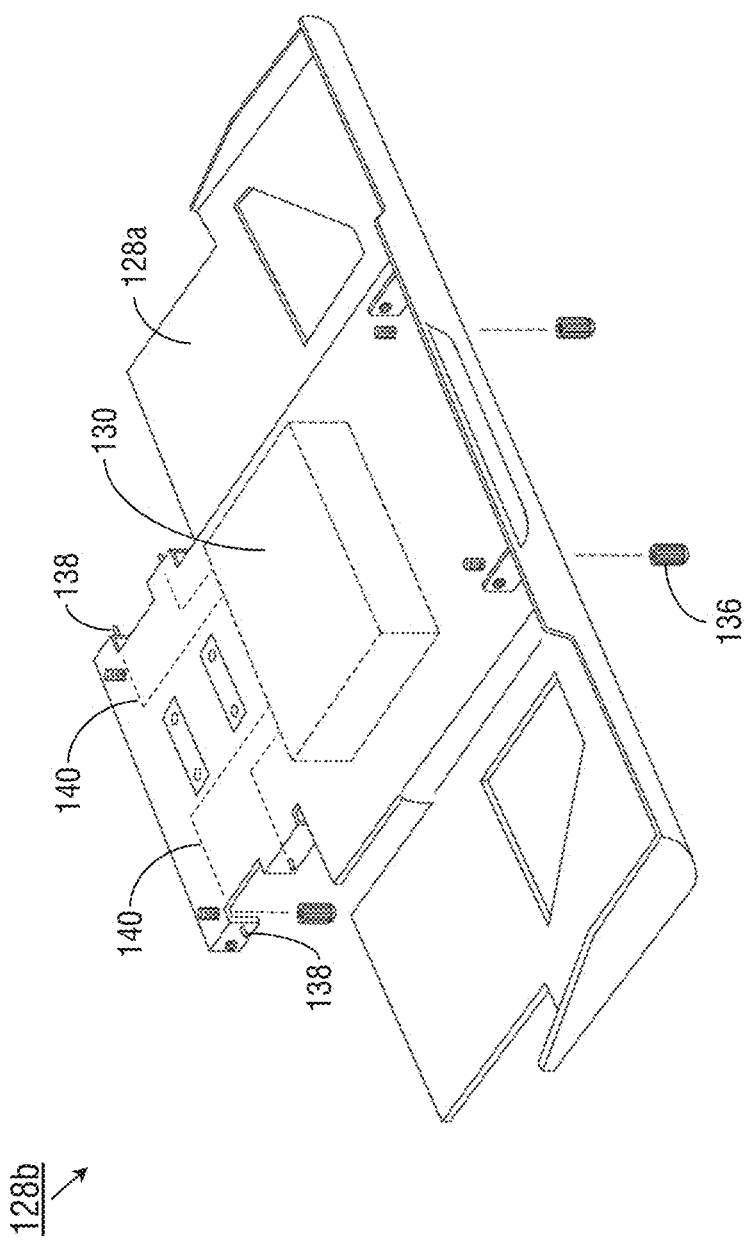
FIG. 3A is an overhead perspective view of a passenger accommodation feature tray of the seating assembly of FIG. 2A.

Referring to FIG. 3A, the passenger accommodation feature tray 128b may be implemented and may function similarly to the passenger accommodation feature tray 128 of FIG. 2A, except that the passenger accommodation feature tray 128b may include fasteners 136 for securing the passenger accommodation feature tray 128b to the seating assembly (102, FIG. 2A). The fasteners 136 may include any combination of screws, nuts, bolts, threaded fasteners, and magnetic elements. The passenger accommodation feature tray 128b may include contact ports (138; e.g., connection ports) at which the dedicated cabling paths (140) within the passenger accommodation feature tray 128b (and extending from the SEB 130, mounted to the tray portion 128a) terminate. For example, the contact ports 138 may be spring-mounted so as to establish a contact-based connection with companion contact ports in the seating assembly 102.

Figure 3B:
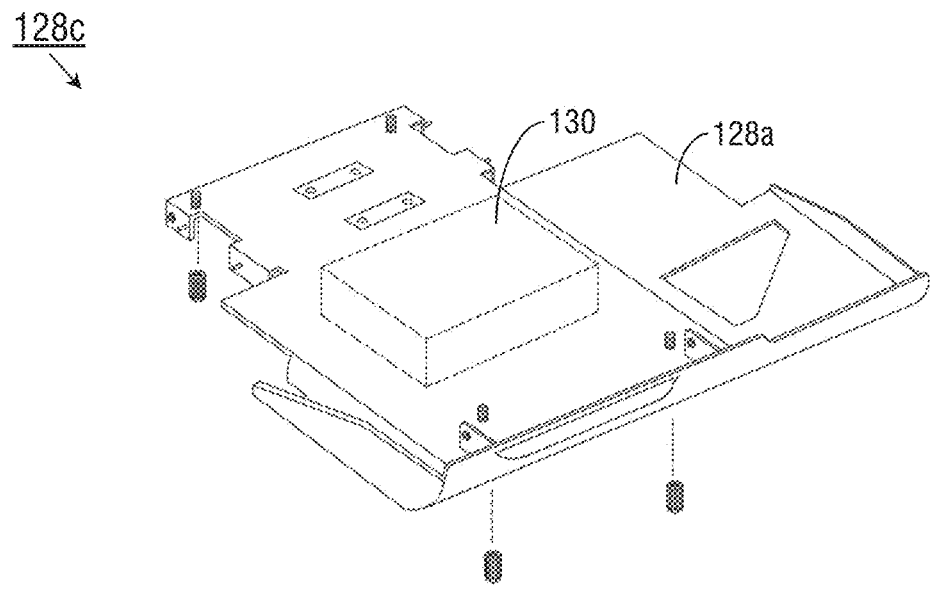
FIGS. 3B and 3C are overhead perspective views of the passenger accommodation feature tray of FIG. 3A for dual-seat and quadruple-seat assemblies.
Figure 3C:
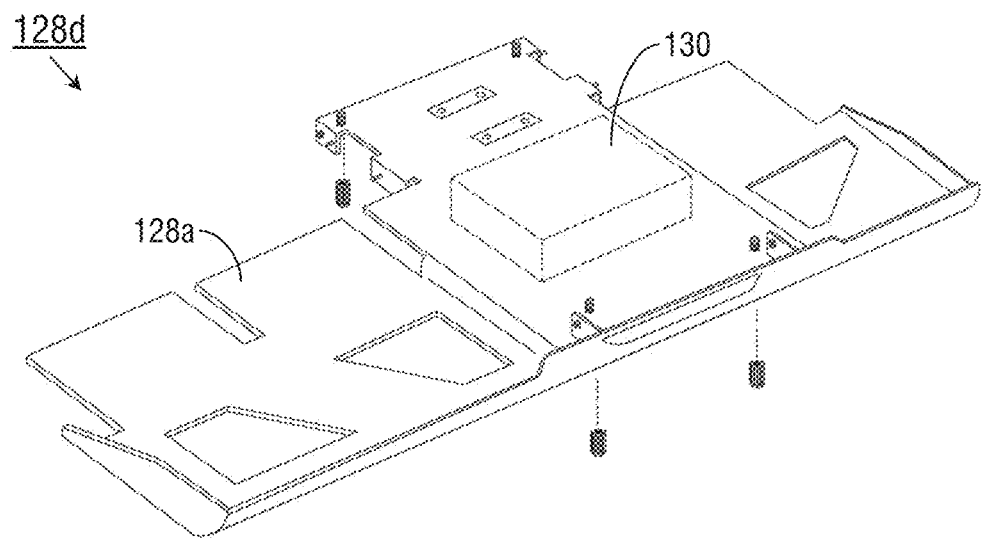

Referring in particular to FIGS. 3B and 3C, the passenger accommodation feature trays 128c and 128d may be implemented and may function similarly to the passenger accommodation feature tray 128b of FIG. 3A, except that the passenger accommodation feature trays 128c, 128d may respectively be configured for dual-seat and quadruple-seat seating assemblies (FIG. 1: 106, 108).

Referring to FIGS. 4A and 4B, the seating assembly 102d may be implemented and may function similarly to the seating assembly 102 of FIG. 2A, except that the seating assembly 102d may include a passenger accommodation feature tray 128d positioned beneath the seatpan (126, FIG. 2A) and seat cushions 124. Referring in particular to FIG. 4B, the passenger accommodation feature tray 128d may slide to the back of the seating assembly 102b (e.g., behind the spreader structures 116, seatbacks 122 and leg structures 120) into a partially mounted configuration.

Figure 4C:
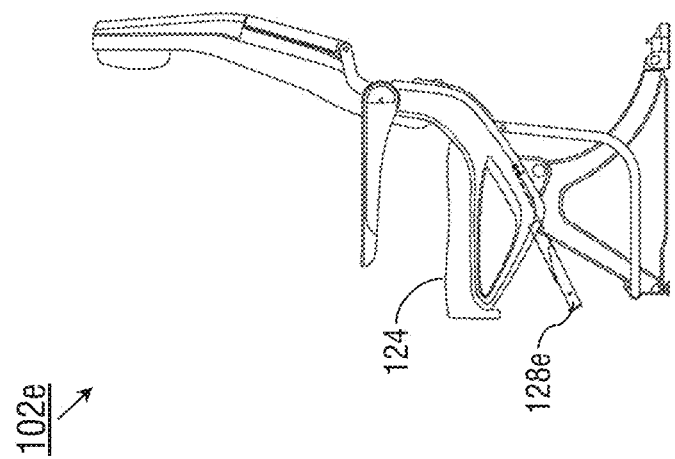
FIG. 4C is a side view of the seating assembly of FIG. 4A in a partially mounted configuration.

Referring to FIG. 4C, the seating assembly 102e may be implemented and may function similarly to the seating assembly 102d of FIG. 4A, except that the seating assembly 102e may include a passenger accommodation feature tray 128e that pivots or tilts downward (e.g., beneath the seat cushion 124 and seatpan (126, FIG. 2A)) into a partially mounted configuration.

Figure 4D:
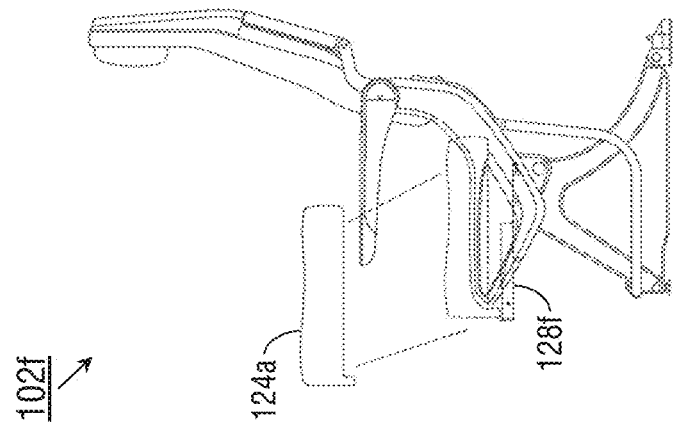
FIG. 4D is a side view of the seating assembly of FIG. 4A in a fully mounted configuration.

Referring to FIG. 4D, the seating assembly 102f may be implemented and may function similarly to the seating assembly 102d of FIG. 4A, except that the seating assembly 102f may include a passenger accommodation feature tray 128f that may be directly accessed while in a fully mounted configuration, e.g., a passenger accommodation feature tray 128f accessible through the seatpan (126, FIG. 2A) by removing the seat cushion (124a).

Figure 5A:
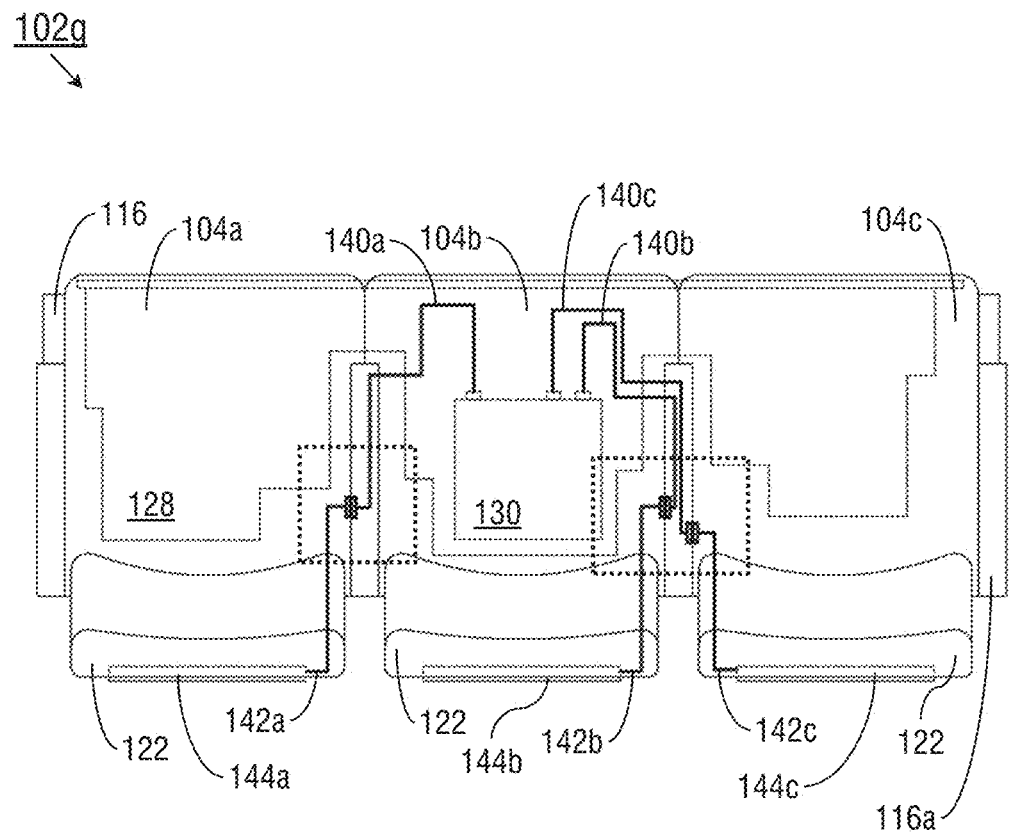
FIG. 5A is an overhead view of the seating assembly of FIG. 2A.
Figure 5A:
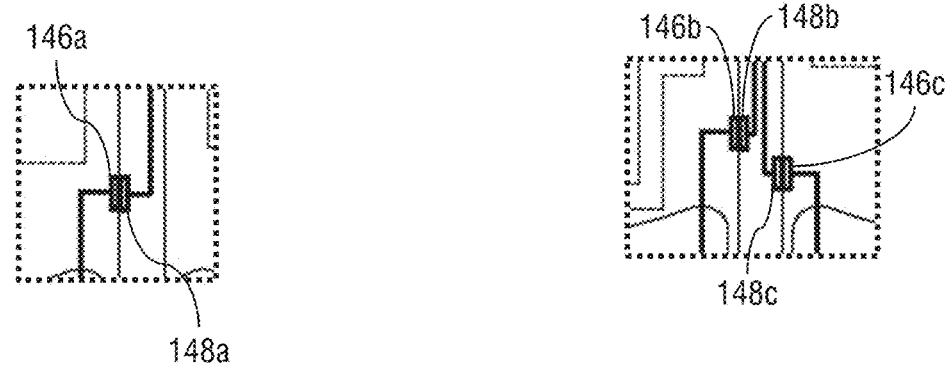

Referring to FIG. 5A, the seating assembly 102g may be implemented and may function similarly to the seating assembly 102 of FIG. 2A, except that the seating assembly 102g may include internal cabling paths (142a-c) within the structure of individual passenger seats 104a-c. The internal cabling paths 142a-c connect display units 144a-c mounted in the seatbacks 122 of the individual passenger seats 104a-c (or other peripheral devices, e.g., control panels or device ports mounted in the armrests 116a) to seat connection ports 146a-c within the structure of the seating assembly 102g. Cabling paths 140a-c within the passenger accommodation feature tray 128 connect the SEB 130 to assembly connection ports 148a-c, circumventing spreader structures 116 and leg structures (120, FIG. 2A) such that the passenger accommodation feature tray 128 may be installed and removed as a unit. When the passenger accommodation feature tray 128 is in a fully mounted configuration relative to the seating assembly 102g (as shown by FIG. 5A), the assembly connection ports 148a-c may make contact with seat connection ports 146a-c, providing stable connections from the SEB 130 to the display units 144a-c.

Figure 5B:
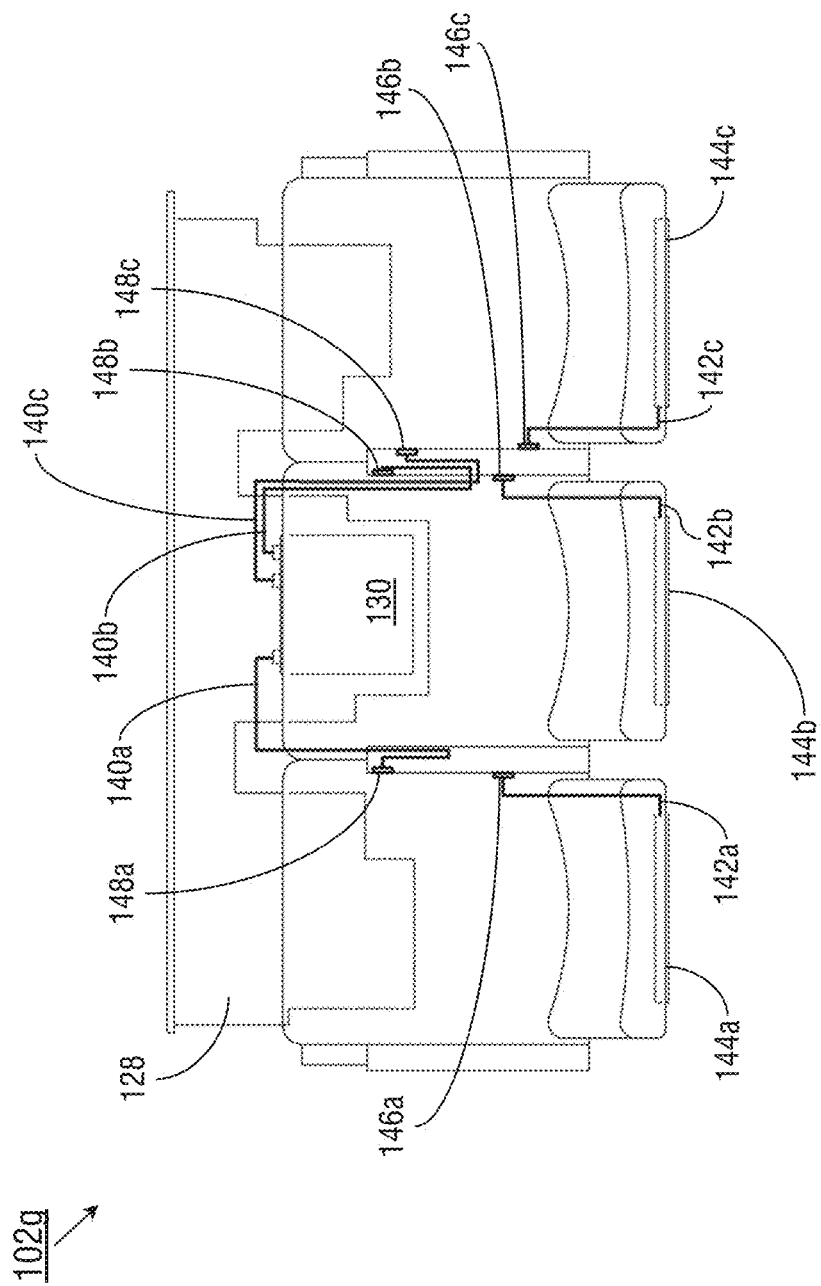
FIG. 5B is an overhead view of the seating assembly of FIG. 5A in a partially mounted configuration.

Referring now to FIG. 5B, when the passenger accommodation feature tray 128 is in a partially mounted configuration relative to, or removed entirely from, the seating assembly 102g, the connections between the SEB 130 and display units 144a-c (via internal cabling paths 140a-c and assembly connection ports 148a-c of the passenger accommodation feature tray 128, and seat connection ports 146a-c and internal cabling paths 142a-c of the seating assembly 102g) may be terminated.

Figure 5C:
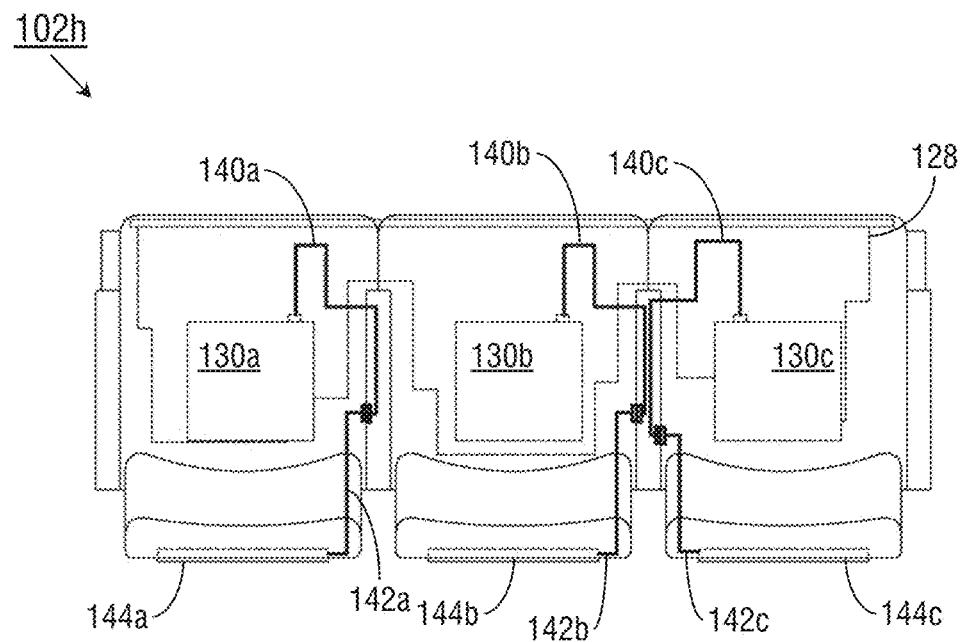
FIGS. 5C and 5D are overhead views of the seating assembly of FIG. 5A.

Referring now to FIG. 5C, the seating assembly 102h may be implemented and may function similarly to the seating assemblies 102c, 102g of FIGS. 2C and 5A, except that the installation of the passenger accommodation feature tray 128 in a fully mounted configuration relative to the seating assembly 102h may allow each individual SEB 130a-c to connect to a display unit 144a-c via the cabling paths 140a-c of the passenger accommodation feature tray 128 and the internal cabling paths 142a-c of the seating assembly 102h.

Figure 5D:
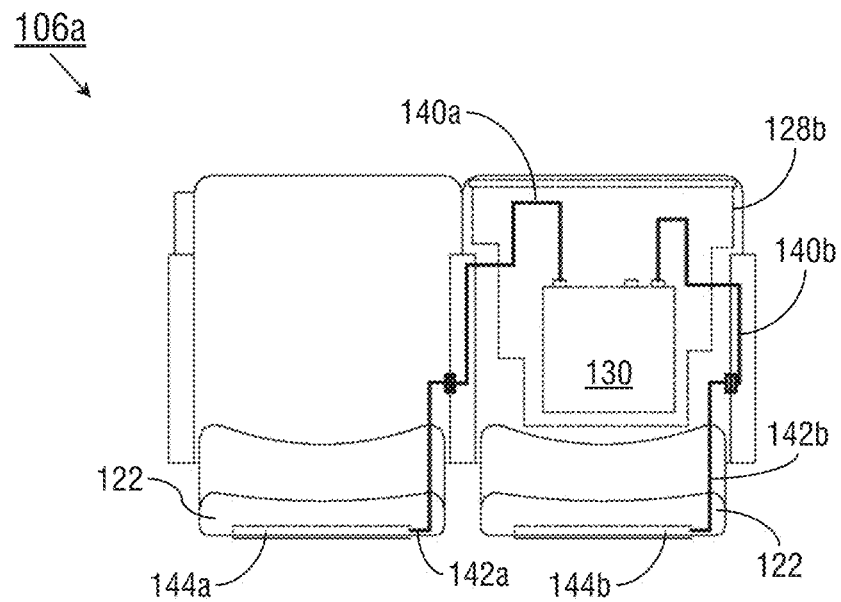

Referring now to FIG. 5D, the seating assembly 106a may be implemented and may function similarly to the seating assemblies 106, 102g of FIGS. 1 and 5A, except that the seating assembly 106a may include a passenger accommodation feature tray 128b (see also FIG. 3A) allowing an SEB 130 to connect to display units 144a-b mounted in the seatbacks 122 via the cabling paths 140a-b of the passenger accommodation feature tray 128b and the internal cabling paths 142a-b of the seating assembly 106a.

Figure 6:
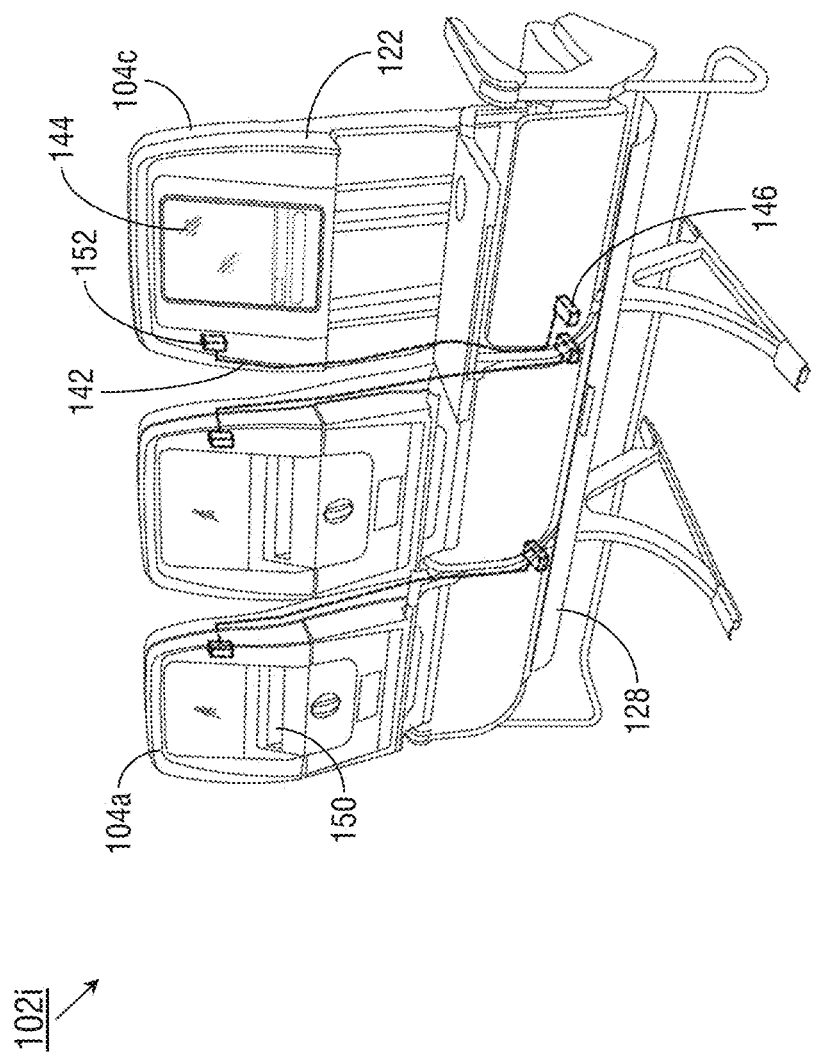
FIG. 6 is a rear perspective view of the seating assembly of FIG. 2A.

Referring to FIG. 6, the seating assembly 102i may be implemented and may function similarly to the seating assembly 102 of FIG. 2A, except that the seating assembly 102i may include a display unit 144 or other peripheral devices accessible through the seatback (122) of the passenger seat 104c in which the display unit 144 is mounted (alternatively, some passenger seats 104a of the seating assembly 102i may include a literature tray 150 instead of a rear-mounted display unit). The seating assembly 102i may include a passenger accommodation feature tray 128 containing one or more SEB (130, FIG. 2B) to which the display unit 144 is connected via the internal cabling path 142 and seat connection port 146 within the passenger seat 104c. The internal cabling path 142 may terminate (opposite the seat connection port 146) at a component connection port 152 to which the display unit 144 may be contactedly connected.

Figure 7A:
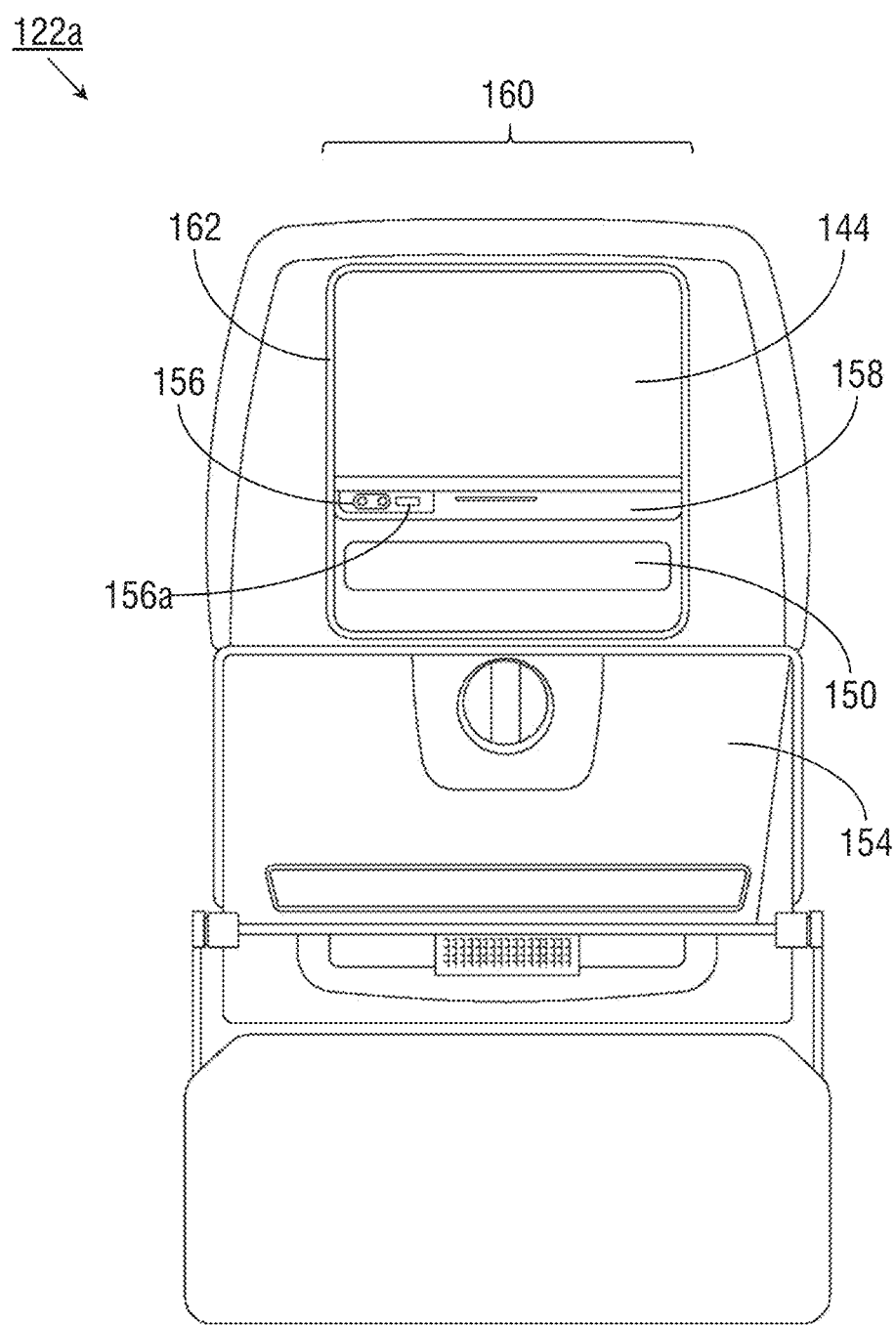
FIGS. 7A and 7B are respectively forward and exploded views of a seatback of FIG. 6.

Referring to FIG. 7A, the seatback 122a may be implemented and may function similarly to the seatback 122 of FIG. 6, except that the seatback 122a may include additional peripheral devices and/or IFE system components (for use by the passenger occupying the passenger seat directly behind the passenger seat 104c (FIG. 6) incorporating the seatback 122a) in addition to the display unit 144. The seatback 122a may include, e.g., a folding tray 154, a power outlet 156, audio ports, data and/or network ports 156a (e.g., USB, HDMI), and a control panel 158 (e.g., for navigating IFE services provided via the display unit 144 such as curated audiovisual content or moving map information). The display unit 144, power outlet 156, data/network port 156a, control panel 158, and/or literature tray 150 may be incorporated into a modular IFE system component panel (160) having one or more removable components, such as a removable bezel (162).

Figure 7B:
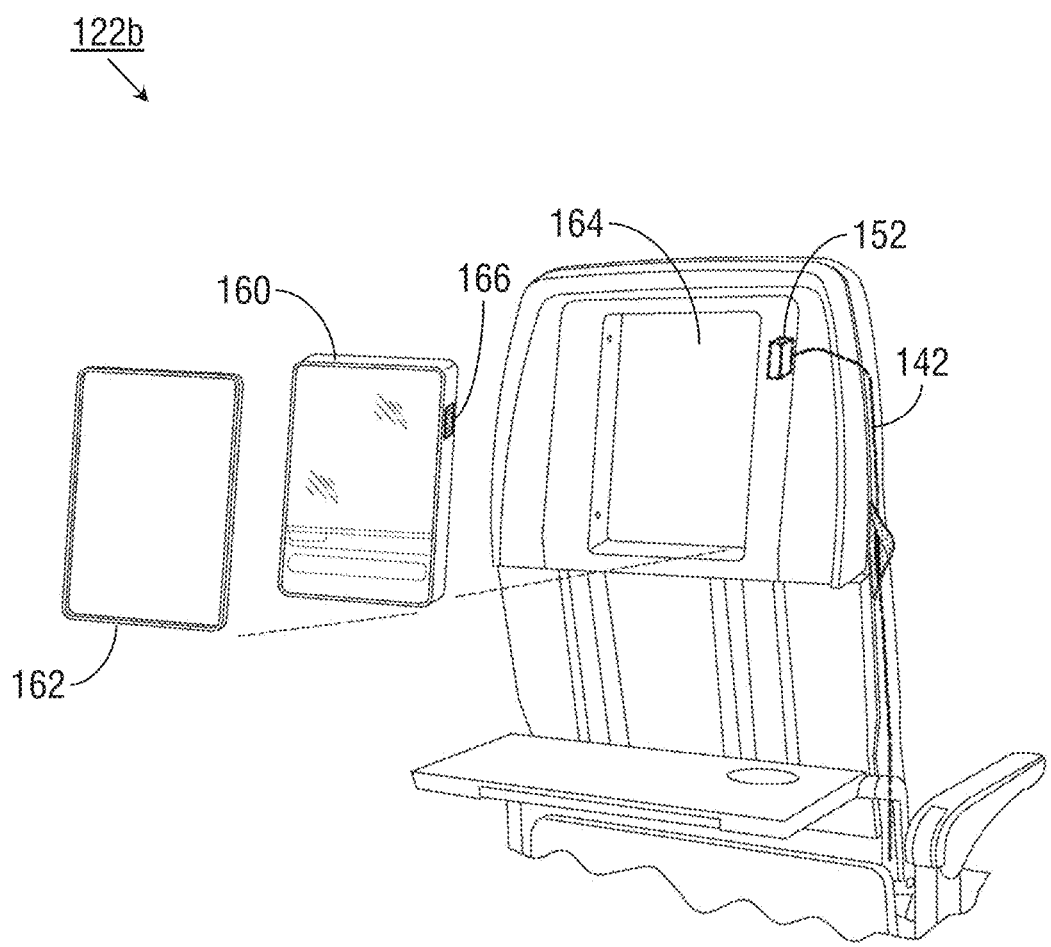

Referring to FIG. 7B, the seatback 122b may be implemented and may function similarly to the seatback 122a of FIG. 7A, except that the modular IFE system component panel 160 may be accessed and removed through the seatback 122b via the removable bezel 162. For example, by removing the bezel 162, the modular IFE system component panel 160 may be removed from its installation slot (164) in the seatback 122b for replacement or maintenance. The modular IFE system component panel 160 may include a component contact port (166); when the modular IFE system component panel 160 is positioned in its installation slot 164, the component contact port 166 may align with the component connection port 152, maintaining a connection to the modular IFE system component panel 160 via the internal cabling path 142 to the SEB 130 (FIG. 2B).

Figure 8:
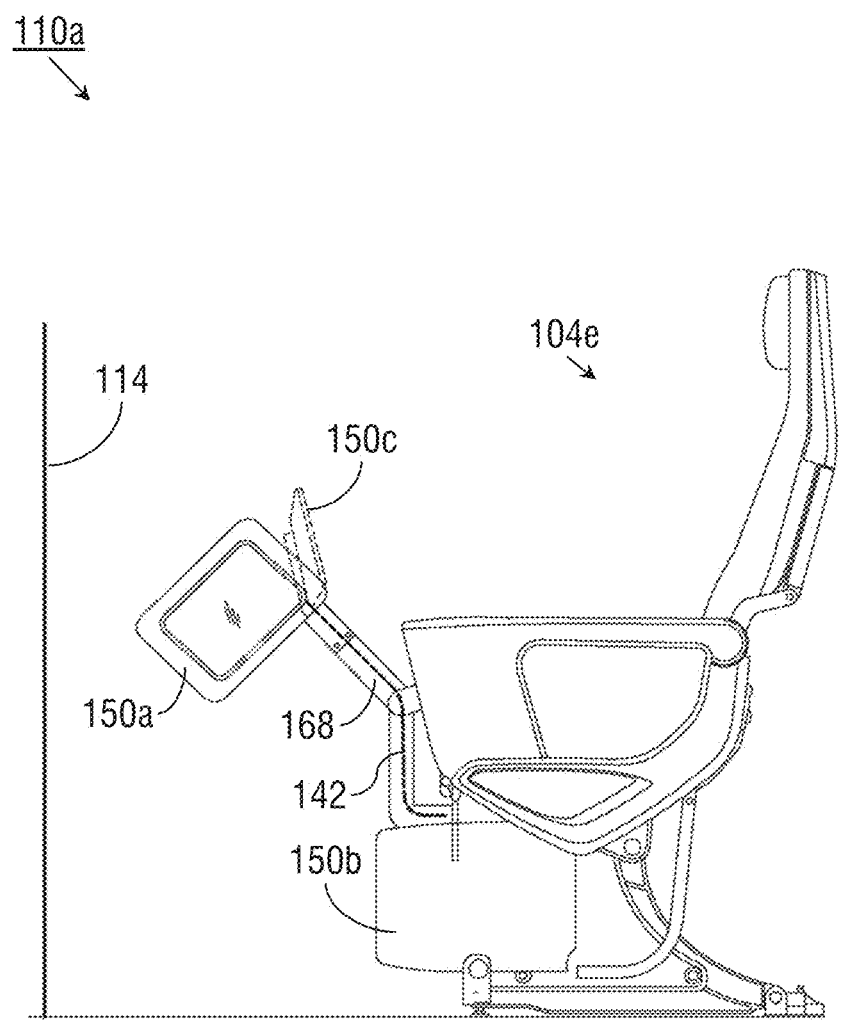
FIG. 8 is a side view of a seating assembly of FIG. 1.

Referring now to FIG. 8, the seating assembly 110a may be implemented and may function similarly to the seating assemblies 110 of FIGS. 1 and 102i of FIG. 6, except that the seating assembly 110a may include additional IFE system components for the use of the occupying passenger and connectable to onboard IFE systems via the SEB 130 (FIG. 2B) and passenger accommodation feature tray 128 (FIG. 6). For example, the seating assembly 110a may be positioned proximate to an exit door (112, FIG. 1) or a forward bulkhead (114) such that the occupants of the seating assembly 110a may not have a seating assembly, and thus a display unit 150 (FIG. 6), directly in front of them. Accordingly, each passenger seat (104e) of the seating assembly 110a may incorporate a display unit (150a) built into the seating assembly for the use of the occupying passenger. For example, the display unit 150a may be attached to the seating assembly 110a via a folding or articulable arm (168), the display unit 150a deployable from a retracted position (150b) within the seating assembly 110a to an extended position (150c) from which the display unit 150a may be viewed by the occupying passenger. The display unit 150a may be connected to the SEB 130 via an internal cabling path 142 terminating in a seat connection port 146 (FIG. 6) which in turn connects to the SEB 130 by contacting with an assembly connection port (148a-c, FIG. 5A) of the passenger accommodation feature tray 128.

As will be appreciated from the above, systems and methods according to embodiments of the inventive concepts disclosed herein may facilitate installation, removal, and upgrade of IFE system components by providing the SEB and all required electrical cabling or wiring as a single replaceable unit. Consequently, structural space allowance need not be made for passenger seat cabling or wiring, and replacement or upgrade of seating assembly components will not require extensive rewiring.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

We claim:

1. A seating assembly for an aircraft, comprising:
a plurality of spaced apart spreader structures;
one or more passenger seats bounded by the spaced apart spreader structures, each passenger seat comprising:
   one or more seating components supported by the spaced apart spreader structures, the seating components configured to support a passenger occupying the passenger seat;
   at least one peripheral device mounted to the passenger seat and associated with at least one passenger accommodation;
   and at least one first cabling path connecting the peripheral device to a first connection port coupled to the at least one seating component;

at least one rail extending laterally across the seating assembly, the at least one rail configured to support the spaced apart spreader structures in a parallel spaced apart relationship; and at least one passenger accommodation feature tray removably mounted to the seating assembly and comprising:

at least one feature component wirelessly connected to at least one aircraft-based service, the feature component configured to provide the at least one passenger accommodation to the one or more passengers;

at least one second connection port configured to connect to the at least one peripheral device by contacting the at least one first connection port; and at least one second cabling path connecting the feature component to the at least one second connection port, the second cabling path configured to circumvent the plurality of spreader structures.

2. The seating assembly of claim 1, wherein the seating component includes at least one of:
a seatback;
a seat frame pivotably coupled to the seatback;
a seatpan coupled to the seat frame; and
a seat cushion positionable above the seatpan.

3. The seating assembly of claim 2, wherein the at least one passenger accommodation feature tray is mounted to the seating assembly beneath one or more of the seatpan and the seat cushion.

4. The seating assembly of claim 3, wherein:
the seat cushion is removably positionable above the seatpan; and
the at least one passenger accommodation feature tray is accessible through the seatpan.

5. The seating assembly of claim 1, wherein:
the seating assembly has a front side and a back side;
the at least one passenger accommodation feature tray is positionable in one or more of a fully mounted configuration and a partially mounted configuration relative to the seating assembly; and
the at least one second connection port is configured to connect to the at least one peripheral device by contacting the at least one first connection port when the passenger accommodation feature tray is in the fully mounted configuration.

6. The seating assembly of claim 5, wherein the at least passenger accommodation feature tray is at least one of slidably mounted to the seating assembly and pivotably mounted to the seating assembly.

7. The seating assembly of claim 6, wherein the at least one passenger accommodation feature tray is articulable to one of the front side and the back side to achieve the partially mounted configuration.

8. The seating assembly of claim 5, wherein the passenger is a first passenger and the at least one peripheral device includes at least one of:
a first peripheral device configured for use by the first passenger; and
a second peripheral device disposed in one or more of the seatback and the back side, the second peripheral device configured for use by at least one second passenger not occupying the passenger seat.

9. The seating assembly of claim 8, wherein the at least one second peripheral device is removably attached to the seatback.

10. The seating assembly of claim 1, wherein the at least one passenger accommodation feature tray is mounted to the seating assembly by one or more fasteners.

11. The seating assembly of claim 1, wherein the at least one peripheral device includes at least one of:
a display unit;
a display controller;
a data port;
an audio port;
a network component connected to at least one in-flight entertainment system of the aircraft, the network component configured to wirelessly connect the in-flight entertainment system to at least one mobile device associated with the passenger;
a window controller;
a seat controller; and
a power port connected to a power source.

12. The seating assembly of claim 1, wherein the at least one passenger accommodation feature tray includes at least one seat electronic box.

13. The seating assembly of claim 1, further comprising:
a plurality of leg structures mountable to an interior surface of the aircraft, the plurality of leg structures configured to support the seating assembly in a parallel spaced apart relationship.

14. The seating assembly of claim 13, wherein the at least one second cabling path is configured to circumvent the plurality of leg structures.

15. The seating assembly of claim 1, wherein the at least one passenger accommodation includes at least one of audio content, video content, position data, Internet connectivity, an in-flight entertainment service, and electrical power.

* * * * *